(12) United States Patent
Cameron

(10) Patent No.: US 7,240,313 B2
(45) Date of Patent: Jul. 3, 2007

(54) METHOD FOR ANALYZING MATERIAL DENSITY VARIATIONS ON A MULTI-LAYER PRINTED CIRCUIT BOARD

(75) Inventor: Andrew James Cameron, Sunnyvale, CA (US)

(73) Assignee: TTM Technologies, Inc., Santa Ana, CA (US)

( * ) Notice: Subject to any disclaimer, the term of this patent is extended or adjusted under 35 U.S.C. 154(b) by 659 days.

(21) Appl. No.: 10/609,068

(22) Filed: Jun. 27, 2003

(65) Prior Publication Data

US 2005/0008319 A1  Jan. 13, 2005

(51) Int. Cl.
*G06F 9/45* (2006.01)
*G01N 9/02* (2006.01)

(52) U.S. Cl. ............... 716/7; 716/4; 716/6; 716/15; 716/19; 73/32 R; 702/23; 702/32; 702/108; 702/117; 702/189

(58) Field of Classification Search ............ 73/32 R; 702/108, 117, 189, 23, 32; 716/6, 7, 15
See application file for complete search history.

(56) References Cited

U.S. PATENT DOCUMENTS

| | | | | |
|---|---|---|---|---|
| 5,528,508 A | * | 6/1996 | Russell et al. ............ | 716/8 |
| 5,552,996 A | * | 9/1996 | Hoffman et al. .......... | 700/121 |
| 5,790,417 A | * | 8/1998 | Chao et al. ............... | 716/21 |
| 5,923,563 A | * | 7/1999 | Lavin et al. .............. | 716/19 |
| 6,066,179 A | | 5/2000 | Allan | |
| 6,109,775 A | * | 8/2000 | Tripathi et al. ........... | 703/5 |
| 6,189,130 B1 | * | 2/2001 | Gofman et al. ........... | 716/7 |
| 6,470,482 B1 | | 10/2002 | Rostoker et al. | |
| 6,484,300 B1 | * | 11/2002 | Kim et al. ................. | 716/7 |
| 6,505,325 B1 | | 1/2003 | Hamamoto | |
| 6,513,148 B1 | | 1/2003 | Gasanov et al. | |
| 6,543,039 B1 | * | 4/2003 | Watanabe .................. | 716/7 |
| 6,609,235 B2 | * | 8/2003 | Ramaswamy et al. ..... | 716/8 |
| 6,723,646 B2 | * | 4/2004 | Su et al. .................... | 438/692 |
| 6,782,512 B2 | * | 8/2004 | Asakawa ................... | 716/1 |
| 6,806,098 B2 | * | 10/2004 | Ohtake et al. ............. | 438/5 |
| 6,844,262 B1 | * | 1/2005 | Nguyen et al. ............ | 438/692 |
| 6,845,497 B2 | * | 1/2005 | Murai et al. .............. | 716/20 |
| 7,013,446 B2 | * | 3/2006 | Ohba et al. ............... | 716/10 |
| 7,055,126 B2 | * | 5/2006 | Gallatin et al. ........... | 716/19 |
| 7,093,212 B2 | * | 8/2006 | DeCamp et al. .......... | 716/4 |
| 2003/0196181 A1 | * | 10/2003 | Sano et al. ................ | 716/4 |

FOREIGN PATENT DOCUMENTS

JP     2002236908 A  *  8/2002

\* cited by examiner

*Primary Examiner*—Hezron Williams
*Assistant Examiner*—Samir M. Shah
(74) *Attorney, Agent, or Firm*—Greenberg Traurig LLP.

(57) ABSTRACT

A method for determining material density variations and prediction of defects on a multi-layer printed circuit board (PCB), in the X, Y, and Z axis, includes a virtual grid creation system and a set of rules for determining the material density in each grid element in the grid system.

17 Claims, 22 Drawing Sheets

FIG. 8A

| Grid Identification | Layer 26 | Layer 25 | Layer 24 | Layer 23 | Layer 22 | Layer 21 |
|---|---|---|---|---|---|---|
| P19 | 0.312 | 0.616 | 0.453 | 0.06 | 0.06 | 0.453 |
| P18 | 0.335 | 0.414 | 0.414 | 0.05 | 0.05 | 0.414 |
| P17 | 0.476 | 0.455 | 0.35 | 0.05 | 0.05 | 0.35 |
| P16 | 0.298 | 0.461 | 0.358 | 0.05 | 0.05 | 0.358 |
| P15 | .0153 | 0.557 | 0.396 | 0.073 | 0.073 | 0.396 |
| P14 | 0.176 | 0.46 | 0.394 | 0.077 | 0.077 | 0.394 |
| P13 | 0.116 | 0.533 | 0.452 | 0.05 | 0.05 | 0.452 |
| P12 | 0.114 | 0.566 | 0.436 | 0.035 | 0.035 | 0.436 |
| Q19 | 0.551 | 0.115 | 0.102 | 0 | 0.005 | 0.102 |
| Q18 | 0.836 | 0.106 | 0.101 | 0 | 0 | 0.101 |
| Q17 | 1.156 | 0.025 | 0 | 0 | 0 | 0 |
| Q16 | 0.866 | 0.184 | 0.131 | 0 | 0 | 0.131 |
| Q15 | 0.841 | 0.117 | 0.089 | 0.476 | 0.476 | 0.089 |
| Q14 | 0.931 | 0.189 | 0.13 | 0.538 | 0.538 | 0.13 |
| Q13 | 0.548 | 0.174 | 0.133 | 0.11 | 0.11 | 0.133 |
| Q12 | .0656 | 0.302 | 0.228 | 0.387 | 0.387 | 0.228 |
| R19 | 0.454 | 0.151 | 0.14 | 0.004 | 0.011 | 0.14 |
| R18 | 0.482 | 0.067 | 0.067 | 0.004 | 0 | 0.067 |
| R17 | 0.553 | 0.11 | 0.064 | 0.008 | 0 | 0.064 |
| R16 | 0.722 | 0.238 | 0.182 | 0.015 | 0.02 | 0.182 |
| R15 | 0.597 | 0.192 | 0.128 | 0.4 | 0.39 | 0.128 |
| R14 | 0.653 | 0.275 | 0.192 | 0.44 | 0.429 | 0.192 |
| R13 | 0.482 | 0.236 | 0.129 | 0.113 | 0.121 | 0.129 |
| R12 | 0.502 | 0.341 | 0.221 | 0.416 | 0.42 | 0.221 |
| S19 | 0.339 | 0.221 | 0.171 | 0.009 | 0.029 | 0.171 |

FIG. 8B

| Layer 20 | Layer 19 | Layer 18 | Layer 17 | Layer 16 | Layer 15 | Layer 14 | Layer 13 |
|---|---|---|---|---|---|---|---|
| 0.06 | 0.060 | 0.453 | 0.06 | 0.06 | 0.228 | 0.06 | 0.06 |
| 0.05 | 0.050 | 0.414 | 0.05 | 0.316 | 0.19 | 0.05 | 0.05 |
| 0.05 | 0.050 | 0.350 | 0.05 | 0.331 | 0.125 | 0.05 | 0.05 |
| 0.05 | 0.050 | 0.358 | 0.05 | 0.186 | 0.134 | 0.05 | 0.05 |
| 0.074 | 0.073 | 0.396 | 0.073 | 0.073 | 0.172 | 0.05 | 0.05 |
| 0.079 | 0.077 | 0.394 | 0.077 | 0.077 | 0.169 | 0.05 | 0.05 |
| 0.05 | 0.050 | 0.452 | 0.05 | 0.05 | 0.227 | 0.05 | 0.05 |
| 0.035 | 0.035 | 0.436 | 0.035 | 0.035 | 0.25 | 0.035 | 0.035 |
| 0 | 0 | 0.102 | 0 | 0.005 | 0.102 | 0 | 0 |
| 0 | 0 | 0.101 | 0 | 0.135 | 0.101 | 0 | 0 |
| 0 | 0.467 | 0.000 | 0.467 | 0.048 | 0 | 0 | 0 |
| 0 | 0.294 | 0.131 | 0.294 | 0.199 | 0.131 | 0 | 0.002 |
| 0.476 | 0.476 | 0.089 | 0.476 | 0.48 | 0.089 | 0.003 | 0.005 |
| 0.543 | 0.538 | 0.13 | 0.538 | 0.538 | 0.13 | 0 | 0.006 |
| 0.11 | 0.11 | 0.133 | 0.11 | 0.11 | 0.133 | 0 | 0.005 |
| 0.387 | 0.387 | 0.228 | 0.387 | 0.387 | 0.228 | 0 | 0 |
| 0 | 0.008 | 0.14 | 0.01 | 0.006 | 0.14 | 0 | 0 |
| 0 | 0.246 | 0.067 | 0.246 | 0.005 | 0.067 | 0 | 0 |
| 0.001 | 0.147 | 0.064 | 0.147 | 0.005 | 0.064 | 0.003 | 0.001 |
| 0.01 | 0.03 | 0.182 | 0.004 | 0.156 | 0.182 | 0.005 | 0.027 |
| 0.392 | 0.387 | 0.128 | 0.375 | 0.384 | 0.128 | 0.008 | 0.011 |
| 0.434 | 0.425 | 0.192 | 0.435 | 0.44 | 0.192 | 0.001 | 0.011 |
| 0.112 | 0.108 | 0.129 | 0.108 | 0.109 | 0.129 | 0 | 0.005 |
| 0.416 | 0.416 | 0.221 | 0.419 | 0.416 | 0.221 | 0 | 0 |
| 0.008 | 0.014 | 0.171 | 0.004 | 0.032 | 0.171 | 0 | 0 |

FIG. 8C

| Layer 12 | Layer 11 | Layer 10 | Layer 9 | Layer 8 | Layer 7 | Layer 6 | Layer 5 |
|---|---|---|---|---|---|---|---|
| 0.454 | 0.06 | 0.06 | 0.228 | 0.06 | 0.06 | 0.228 | 0.283 |
| 0.333 | 0.05 | 0.05 | 0.19 | 0.05 | 0.316 | 0.19 | 0.316 |
| 0.304 | 0.05 | 0.05 | 0.125 | 0.05 | 0.331 | 0.125 | 0.331 |
| 0.297 | 0.05 | 0.05 | 0.134 | 0.05 | 0.186 | 0.134 | 0.186 |
| 0.395 | 0.073 | 0.073 | 0.172 | 0.073 | 0.079 | 0.172 | 0.068 |
| 0.314 | 0.077 | 0.077 | 0.169 | 0.077 | 0.086 | 0.169 | 0.052 |
| 0.268 | 0.05 | 0.05 | 0.227 | 0.05 | 0.06 | 0.227 | 0.05 |
| 0.44 | 0.035 | 0.035 | 0.25 | 0.035 | 0.035 | 0.25 | 0.046 |
| 0.115 | 0 | 0 | 0.102 | 0.013 | 0 | 0.102 | 1.03 |
| 0.106 | 0 | 0 | 0.101 | 0 | 0.135 | 0.101 | 0.135 |
| 0.056 | 0 | 0.467 | 0 | 0 | 0.048 | 0 | 0.048 |
| 0.084 | 0 | 0.294 | 0.131 | 0 | 0.199 | 0.131 | 0.199 |
| 0.111 | 0.476 | 0.476 | 0.089 | 0.48 | 0.49 | 0.089 | 0.129 |
| 0.152 | 0.538 | 0.538 | 0.13 | 0.538 | 0.54 | 0.13 | 0.036 |
| 0.069 | 0.11 | 0.117 | 0.133 | 0.11 | 0.122 | 0.133 | 0.027 |
| 0.337 | 0.387 | 0.387 | 0.228 | 0.387 | 0.387 | 0.228 | 0.024 |
| 0.151 | 0.004 | 0.01 | 0.14 | 0.01 | 0 | 0.14 | 0.63 |
| 0.067 | 0 | 0.246 | 0.067 | 0 | 0.008 | 0.067 | 0 |
| 0.046 | 0 | 0.147 | 0.064 | 0.003 | 0.013 | 0.064 | 0.005 |
| 0.122 | 0.003 | 0.02 | 0.182 | 0.041 | 0.189 | 0.182 | 0.189 |
| 0.193 | 0.385 | 0.403 | 0.128 | 0.393 | 0.403 | 0.128 | 0.169 |
| 0.285 | 0.432 | 0.432 | 0.192 | 0.433 | 0.433 | 0.192 | 0.058 |
| 0.215 | 0.108 | 0.119 | 0.129 | 0.112 | 0.128 | 0.129 | 0.026 |
| 0.365 | 0.416 | 0.418 | 0.221 | 0.416 | 0.417 | 0.221 | 0.039 |
| 0.218 | 0.013 | 0.025 | 0.171 | 0.015 | 0.008 | 0.171 | 0.028 |

FIG. 8D

| Layer 4 | Layer 3 | Layer 2 | Layer 1 | Total Cu In Grid | % of the Average |
|---|---|---|---|---|---|
| 0.271 | 0.228 | 0.454 | 0.683 | 6.064 | 135% |
| 0.495 | 0.19 | 0.333 | 0.646 | 6.088 | 136% |
| 0.185 | 0.125 | 0.293 | 0.353 | 5.109 | 114% |
| 0.072 | 0.134 | 0.299 | 0.386 | 4.481 | 100% |
| 0.083 | 0.172 | 0.395 | 0.446 | 4.81 | 107% |
| 0.071 | 0.169 | 0.289 | 0.541 | 4.642 | 103% |
| 0.069 | 0.227 | 0.371 | 0.887 | 5.168 | 115% |
| 0.037 | 0.25 | 0.44 | 0.38 | 4.751 | 106% |
| 0.425 | 0.102 | 0.14 | 1.034 | 4.147 | 92% |
| 1.269 | 0.101 | 0.106 | 1.004 | 4.539 | 101% |
| 0.42 | 0 | 0.025 | 0.551 | 3.778 | 84% |
| 0.005 | 0.131 | 0.171 | 0.951 | 4.659 | 104% |
| 0.143 | 0.089 | 0.095 | 1.174 | 8.023 | 179% |
| 0.062 | 0.13 | 0.143 | 1.138 | 8.954 | 199% |
| 0.021 | 0.133 | 0.204 | 1.275 | 4.373 | 97% |
| 0.025 | 0.228 | 0.321 | 0.795 | 7.926 | 176% |
| 0.353 | 0.14 | 0.168 | 0.683 | 3.633 | 81% |
| 0.999 | 0.067 | 0.067 | 1.32 | 4.226 | 94% |
| 0.425 | 0.064 | 0.071 | 0.711 | 2.844 | 63% |
| 0.023 | 0.182 | 0.2 | 0.677 | 3.965 | 88% |
| 0.146 | 0.128 | 0.19 | 0.563 | 6.877 | 153% |
| 0.08 | 0.192 | 0.256 | 0.568 | 7.864 | 175% |
| 0.02 | 0.129 | 0.268 | 1.022 | 4.315 | 96% |
| 0.048 | 0.221 | 0.346 | 0.743 | 8.101 | 180% |
| 0.072 | 0.171 | 0.249 | 0.327 | 2.808 | 63% |

|  |  |  |  |  |  |  |
|---|---|---|---|---|---|---|
| S18 | 0.267 | 0.213 | 0.166 | 0.062 | 0.104 | 0.166 |
| S17 | 0.337 | 0.376 | 0.33 | 0.058 | 0.084 | 0.33 |
| S16 | 0.326 | 0.283 | 0.204 | 0.126 | 0.104 | 0.204 |
| S15 | 0.357 | 0.198 | 0.162 | 0.106 | 0.128 | 0.162 |
| S14 | 0.417 | 0.291 | 0.212 | 0.082 | 0.085 | 0.212 |
| S13 | 0.238 | 0.155 | 0.111 | 0.093 | 0.069 | 0.111 |
| S12 | 0.057 | 0.292 | 0.181 | 0.021 | 0.011 | 0.181 |
| T19 | 0.401 | 0.544 | 0.344 | 0.034 | 0.052 | 0.344 |
| T18 | 0.355 | 0.372 | 0.288 | 0.143 | 0.133 | 0.288 |
| T17 | 0.384 | 0.578 | 0.495 | 0.112 | 0.148 | 0.495 |
| T16 | 0.347 | 0.431 | 0.349 | .0155 | 0.214 | 0.349 |
| T15 | 0.265 | 0.302 | 0.226 | .0144 | 0.209 | 0.226 |
| T14 | 0.38 | 0.681 | 0.602 | .0161 | 0.186 | 0.602 |
| T13 | 0.246 | 0.265 | 0.179 | 0.15 | 0.13 | 0.179 |
| T12 | 0.048 | 0.293 | 0.172 | 0.048 | 0.025 | 0.172 |
| U19 | 0.332 | 0.453 | 0.254 | 0.038 | 0.048 | 0.254 |
| U18 | 0.217 | 0.169 | 0.122 | 0.057 | 0.089 | 0.122 |
| U17 | 0.243 | 0.187 | 0.143 | 0.204 | 0.21 | 0.143 |
| U16 | 0.239 | 0.333 | 0.186 | 0.066 | 0.091 | 0.186 |
| U15 | 0.252 | 0.224 | 0.163 | 0.064 | 0.078 | 0.163 |
| U14 | 0.381 | 0.328 | 0.271 | 0.168 | 0.205 | 0.271 |
| U13 | 0.2 | 0.225 | 0.14 | 0.114 | 0.093 | 0.14 |
| U12 | 0.059 | 0.297 | 0.175 | 0.042 | 0.019 | 0.175 |
| V19 | 0.198 | 0.221 | 0.098 | 0.011 | 0.04 | 0.098 |
| V18 | 0.318 | 0.253 | 0.235 | 0.048 | 0.074 | 0.235 |
| V17 | 0.42 | 0.54 | 0.543 | 0.128 | 0.131 | 0.543 |
| V16 | 0.314 | 0.411 | 0.26 | 0.112 | 0.094 | 0.26 |

*FIG. 8E*

| | | | | | | | |
|---|---|---|---|---|---|---|---|
| 0.113 | 0.068 | 0.166 | 0.059 | 0.054 | 0.166 | 0.002 | 0.008 |
| 0.071 | 0.064 | 0.33 | 0.064 | 0.08 | 0.33 | 0.007 | 0.013 |
| 0.106 | 0.08 | 0.204 | 0.066 | 0.057 | 0.204 | 0.007 | 0.003 |
| 0.116 | 0.11 | 0.162 | 0.075 | 0.093 | 0.162 | 0.005 | 0.01 |
| 0.073 | 0.056 | 0.212 | 0.058 | 0.069 | 0.212 | 0 | 0.006 |
| 0.07 | 0.062 | 0.111 | 0.063 | 0.064 | 0.111 | 0 | 0 |
| 0.021 | 0.014 | 0.181 | 0.015 | 0.018 | 0.181 | 0 | 0 |
| 0.048 | 0.03 | 0.344 | 0.025 | 0.042 | 0.344 | 0 | 0 |
| 0.124 | 0.128 | 0.288 | 0.117 | 0.11 | 0.288 | 0.005 | 0.008 |
| 0.103 | 0.122 | 0.495 | 0.126 | 0.118 | 0.495 | 0.006 | 0.001 |
| 0.185 | 0.135 | 0.349 | 0.175 | 0.165 | 0.349 | 0.004 | 0 |
| 0.185 | 0.139 | 0.226 | 0.162 | 0.169 | 0.226 | 0.037 | 0.027 |
| 0.152 | 0.129 | 0.602 | 0.17 | 0.159 | 0.602 | 0.006 | 0.027 |
| 0.152 | 0.168 | 0.179 | 0.092 | 0.085 | 0.179 | 0.055 | 0.017 |
| 0.042 | 0.043 | 0.172 | 0.016 | 0.025 | 0.172 | 0.018 | 0.001 |
| 0.037 | 0.047 | 0.254 | 0.05 | 0.037 | 0.254 | 0 | 0.012 |
| 0.082 | 0.051 | 0.122 | 0.072 | 0.083 | 0.122 | 0.01 | 0.033 |
| 0.204 | 0.216 | 0.143 | 0.17 | 0.178 | 0.143 | 0.007 | 0.034 |
| 0.08 | 0.078 | 0.186 | 0.06 | 0.102 | 0.186 | 0 | 0.033 |
| 0.075 | 0.067 | 0.163 | 0.053 | 0.072 | 0.163 | 0.051 | 0.04 |
| 0.167 | 0.133 | 0.271 | 0.165 | 0.2 | 0.271 | 0.031 | 0.009 |
| 0.14 | 0.037 | 0.14 | 0.068 | 0.092 | 0.14 | 0.062 | 0.009 |
| 0.037 | 0.023 | 0.175 | 0.02 | 0.025 | 0.175 | 0.01 | 0.001 |
| 0.026 | 0.008 | 0.098 | 0.014 | 0.019 | 0.098 | 0 | 0.001 |
| 0.08 | 0.081 | 0.235 | 0.049 | 0.098 | 0.235 | 0.011 | 0.059 |
| 0.144 | 0.135 | 0.543 | 0.117 | 0.135 | 0.543 | 0.005 | 0.028 |
| 0.139 | 0.107 | 0.26 | 0.09 | 0.152 | 0.26 | 0 | 0 |

FIG. 8F

| | | | | | | | |
|---|---|---|---|---|---|---|---|
| 0.224 | 0.023 | 0.053 | 0.166 | 0.075 | 0.081 | 0.166 | 0.137 |
| 0.375 | 0.058 | 0.07 | 0.33 | 0.093 | 0.055 | 0.33 | 0.112 |
| 0.256 | 0.093 | 0.126 | 0.204 | 0.114 | 0.045 | 0.204 | 0.104 |
| 0.222 | 0.089 | 0.166 | 0.162 | 0.148 | 0.088 | 0.162 | 0.106 |
| 0.309 | 0.046 | 0.082 | 0.212 | 0.115 | 0.073 | 0.212 | 0.066 |
| 0.154 | 0.076 | 0.038 | 0.111 | 0.079 | 0.077 | 0.111 | 0.049 |
| 0.322 | 0.018 | 0.021 | 0.181 | 0.024 | 0.008 | 0.181 | 0.023 |
| 0.567 | 0.022 | 0.042 | 0.344 | 0.031 | 0.038 | 0.344 | 0.05 |
| 0.375 | 0.115 | 0.139 | 0.288 | 0.145 | 0.139 | 0.288 | 0.154 |
| 0.587 | 0.08 | 0.147 | 0.495 | 0.145 | 0.104 | 0.495 | 0.139 |
| 0.382 | 0.15 | 0.176 | 0.349 | 0.168 | 0.176 | 0.349 | 0.167 |
| 0.304 | 0.182 | 0.144 | 0.226 | 0.183 | 0.172 | 0.226 | 0.174 |
| 0.707 | 0.101 | 0.17 | 0.602 | 0.182 | 0.144 | 0.602 | 0.135 |
| 0.254 | 0.144 | 0.121 | 0.179 | 0.186 | 0.107 | 0.179 | 0.152 |
| 0.323 | 0.033 | 0.02 | 0.172 | 0.067 | 0.019 | 0.172 | 0.043 |
| 0.473 | 0.016 | 0.034 | 0.254 | 0.036 | 0.056 | 0.254 | 0.047 |
| 0.181 | 0.083 | 0.079 | 0.122 | 0.108 | 0.103 | 0.122 | 0.097 |
| 0.205 | 0.239 | 0.195 | 0.143 | 0.205 | 0.223 | 0.143 | 0.276 |
| 0.274 | 0.202 | 0.073 | 0.186 | 0.088 | 0.088 | 0.186 | 0.076 |
| 0.219 | 0.164 | 0.088 | 0.163 | 0.075 | 0.064 | 0.163 | 0.094 |
| 0.365 | 0.108 | 0.151 | 0.271 | 0.166 | 0.143 | 0.271 | 0.159 |
| 0.21 | 0.057 | 0.11 | 0.14 | 0.137 | 0.072 | 0.14 | 0.095 |
| 0.327 | 0.017 | 0.027 | 0.175 | 0.063 | 0.013 | 0.175 | 0.024 |
| 0.215 | 0.123 | 0.03 | 0.098 | 0.014 | 0.008 | 0.098 | 0.019 |
| 0.3 | 0.142 | 0.082 | 0.235 | 0.093 | 0.074 | 0.235 | 0.085 |
| 0.673 | 0.141 | 0.126 | 0.543 | 0.121 | 0.103 | 0.543 | 0.118 |
| 0.387 | 0.2 | 0.125 | 0.26 | 0.113 | 0.137 | 0.26 | 0.102 |

*FIG. 8G*

| | | | | | |
|---|---|---|---|---|---|
| 0.239 | 0.166 | 0.218 | 0.478 | 3.64 | 81% |
| 0.132 | 0.33 | 0.394 | 0.417 | 5.17 | 115% |
| 0.07 | 0.204 | 0.298 | 0.326 | 4.018 | 89% |
| 0.073 | 0.162 | 0.265 | 0.257 | 3.746 | 83% |
| 0.049 | 0.212 | 0.317 | 0.236 | 3.914 | 87% |
| 0.062 | 0.111 | 0.171 | 0.626 | 2.923 | 65% |
| 0.058 | 0.181 | 0.292 | 0.415 | 2.897 | 64% |
| 0.136 | 0.344 | 0.571 | 0.402 | 5.443 | 121% |
| 0.091 | 0.288 | 0.373 | 0.425 | 5.467 | 122% |
| 0.101 | 0.495 | 0.632 | 0.607 | 7.705 | 172% |
| 0.192 | 0.349 | 0.433 | 0.443 | 6.541 | 146% |
| 0.179 | 0.226 | 0.304 | 0.336 | 5.199 | 116% |
| 0.138 | 0.602 | 0.646 | 0.831 | 9.319 | 207% |
| 0.061 | 0.179 | 0.255 | 0.73 | 4.623 | 103% |
| 0.061 | 0.172 | 0.293 | 0.476 | 3.098 | 69% |
| 0.048 | 0.254 | 0.482 | 0.347 | 4.371 | 97% |
| 0.104 | 0.122 | 0.185 | 0.15 | 2.807 | 62% |
| 0.154 | 0.143 | 0.203 | 0.241 | 4.595 | 102% |
| 0.078 | 0.186 | 0.281 | 0.255 | 3.799 | 85% |
| 0.052 | 0.163 | 0.28 | 0.277 | 3.43 | 76% |
| 0.127 | 0.271 | 0.371 | 0.36 | 5.634 | 125% |
| 0.084 | 0.14 | 0.239 | 0.741 | 3.765 | 84% |
| 0.062 | 0.175 | 0.297 | 0.476 | 3.064 | 68% |
| 0.023 | 0.098 | 0.249 | 0.18 | 2.085 | 46% |
| 0.118 | 0.235 | 0.253 | 0.279 | 4.142 | 92% |
| 0.146 | 0.543 | 0.54 | 0.781 | 8.333 | 186% |
| 0.108 | 0.26 | 0.326 | 0.269 | 5.006 | 111% |

*FIG. 8H*

| | | | | | | |
|---|---|---|---|---|---|---|
| V15 | 0.313 | 0.31 | 0.195 | 0.055 | 0.085 | 0.195 |
| V14 | 0.307 | 0.321 | 0.28 | 0.172 | 0.212 | 0.28 |
| V13 | 0.24 | 0.208 | 0.162 | 0.09 | 0.108 | 0.162 |
| V12 | 0.197 | 0.449 | 0.255 | 0.036 | 0.025 | 0.255 |
| W19 | 0.435 | 0.388 | 0.21 | 0.021 | 0.038 | 0.21 |
| W18 | 0.473 | 0.307 | 0.193 | 0.039 | 0.069 | 0.193 |
| W17 | 0.342 | 0.42 | 0.313 | 0.137 | 0.134 | 0.313 |
| W16 | 0.34 | 0.374 | 0.251 | 0.061 | 0.069 | 0.251 |
| W15 | 0.312 | 0.404 | 0.336 | 0.065 | 0.071 | 0.336 |
| W14 | 0.352 | 0.732 | 0.573 | 0.102 | 0.127 | 0.573 |
| W13 | 0.351 | 0.326 | 0.271 | 0.076 | 0.091 | 0.271 |
| W12 | 0.305 | 0.471 | 0.347 | 0.037 | 0.036 | 0.347 |
| X19 | 0.436 | 0.477 | 0.287 | 0.035 | 0.043 | 0.287 |
| X18 | 0.339 | 0.265 | 0.188 | 0.041 | 0.082 | 0.188 |
| X17 | 0.275 | 0.278 | 0.212 | 0.058 | 0.092 | 0.212 |
| X16 | 0.366 | 0.428 | 0.379 | 0.097 | 0.101 | 0.379 |
| X15 | 0.355 | 0.394 | 0.33 | 0.092 | 0.101 | 0.33 |
| X14 | 0.369 | 0.288 | 0.25 | 0.062 | 0.121 | 0.25 |
| X13 | 0.734 | 0.203 | 0.178 | 0.279 | 0.266 | 0.178 |
| X12 | 0.522 | 0.35 | 0.239 | 0.284 | 0.303 | 0.239 |
| Y19 | 0.365 | 0.475 | 0.271 | 0.018 | 0.025 | 0.271 |
| Y18 | 0.316 | 0.208 | 0.169 | 0.041 | 0.061 | 0.169 |
| Y17 | 0.211 | 0.138 | 0.116 | 0.063 | 0.039 | 0.116 |
| Y16 | 0.247 | 0.183 | 0.158 | 0.104 | 0.051 | 0.158 |
| Y15 | 0.244 | 0.166 | 0.142 | 0.067 | 0.076 | 0.142 |
| Y14 | 0.2 | 0.125 | 0.11 | 0.007 | 0.026 | 0.11 |

FIG. 8I

| | | | | | | | |
|---|---|---|---|---|---|---|---|
| 0.047 | 0.056 | 0.195 | 0.058 | 0.07 | 0.195 | 0.043 | 0.035 |
| 0.186 | 0.146 | 0.28 | 0.155 | 0.199 | 0.28 | 0.041 | 0.008 |
| 0.086 | 0.063 | 0.162 | 0.056 | 0.093 | 0.162 | 0.037 | 0.005 |
| 0.044 | 0.022 | 0.255 | 0.034 | 0.023 | 0.255 | 0.012 | 0 |
| 0.02 | 0.02 | 0.21 | 0.01 | 0.011 | 0.21 | 0 | 0 |
| 0.083 | 0.05 | 0.193 | 0.051 | 0.05 | 0.193 | 0.005 | 0.023 |
| 0.134 | 0.152 | 0.313 | 0.152 | 0.127 | 0.313 | 0 | 0.012 |
| 0.067 | 0.042 | 0.251 | 0.053 | 0.095 | 0.251 | 0.004 | 0.009 |
| 0.058 | 0.067 | 0.336 | 0.044 | 0.072 | 0.336 | 0.015 | 0.01 |
| 0.102 | 0.102 | 0.573 | 0.103 | 0.102 | 0.573 | 0.03 | 0.011 |
| 0.085 | 0.101 | 0.271 | 0.088 | 0.087 | 0.271 | 0.026 | 0.002 |
| 0.058 | 0.043 | 0.347 | 0.067 | 0.019 | 0.347 | 0.026 | 0 |
| 0.028 | 0.015 | 0.287 | 0.016 | 0.018 | 0.287 | 0 | 0 |
| 0.062 | 0.049 | 0.188 | 0.043 | 0.041 | 0.188 | 0.005 | 0 |
| 0.063 | 0.059 | 0.212 | 0.053 | 0.039 | 0.212 | 0 | 0 |
| 0.08 | 0.086 | 0.379 | 0.074 | 0.082 | 0.379 | 0.001 | 0.005 |
| 0.075 | 0.076 | 0.33 | 0.095 | 0.08 | 0.33 | 0.005 | 0 |
| 0.061 | 0.123 | 0.25 | 0.155 | 0.072 | 0.25 | 0.005 | 0.005 |
| 0.262 | 0.263 | 0.178 | 0.27 | 0.3 | 0.178 | 0.008 | 0 |
| 0.299 | 0.286 | 0.239 | 0.289 | 0.284 | 0.239 | 0.025 | 0 |
| 0.012 | 0.008 | 0.271 | 0.017 | 0.012 | 0.271 | 0 | 0 |
| 0.065 | 0.036 | 0.169 | 0.028 | 0.033 | 0.169 | 0.005 | 0.018 |
| 0.034 | 0.035 | 0.116 | 0.032 | 0.035 | 0.116 | 0 | 0 |
| 0.074 | 0.06 | 0.158 | 0.05 | 0.072 | 0.158 | 0 | 0.005 |
| 0.039 | 0.067 | 0.142 | 0.051 | 0.019 | 0.142 | 0 | 0 |
| 0.017 | 0.05 | 0.11 | 0.029 | 0.006 | 0.11 | 0 | 0.005 |

FIG. 8J

| | | | | | | | |
|---|---|---|---|---|---|---|---|
| 0.333 | 0.146 | 0.067 | 0.195 | 0.061 | 0.061 | 0.195 | 0.065 |
| 0.371 | 0.131 | 0.169 | 0.28 | 0.202 | 0.157 | 0.28 | 0.153 |
| 0.233 | 0.069 | 0.076 | 0.162 | 0.101 | 0.038 | 0.162 | 0.078 |
| 0.498 | 0.013 | 0.03 | 0.255 | 0.036 | 0.018 | 0.255 | 0.025 |
| 0.335 | 0.173 | 0.027 | 0.21 | 0.017 | 0.004 | 0.21 | 0.027 |
| 0.298 | 0.189 | 0.06 | 0.193 | 0.048 | 0.076 | 0.193 | 0.076 |
| 0.433 | 0.181 | 0.148 | 0.313 | 0.129 | 0.143 | 0.313 | 0.141 |
| 0.34 | 0.174 | 0.059 | 0.251 | 0.09 | 0.069 | 0.251 | 0.058 |
| 0.426 | 0.14 | 0.056 | 0.336 | 0.079 | 0.061 | 0.336 | 0.099 |
| 0.755 | 0.079 | 0.11 | 0.573 | 0.127 | 0.092 | 0.573 | 0.097 |
| 0.387 | 0.063 | 0.076 | 0.271 | 0.105 | 0.081 | 0.271 | 0.087 |
| 0.532 | 0.01 | 0.025 | 0.347 | 0.057 | 0.043 | 0.347 | 0.053 |
| 0.476 | 0.132 | 0.015 | 0.287 | 0.016 | 0.013 | 0.287 | 0.024 |
| 0.23 | 0.16 | 0.045 | 0.188 | 0.05 | 0.062 | 0.188 | 0.086 |
| 0.259 | 0.19 | 0.063 | 0.212 | 0.068 | 0.04 | 0.212 | 0.037 |
| 0.416 | 0.15 | 0.101 | 0.379 | 0.101 | 0.095 | 0.379 | 0.121 |
| 0.397 | 0.063 | 0.13 | 0.33 | 0.115 | 0.084 | 0.33 | 0.115 |
| 0.342 | 0.088 | 0.075 | 0.25 | 0.086 | 0.122 | 0.25 | 0.054 |
| 0.194 | 0.279 | 0.297 | 0.178 | 0.294 | 0.252 | 0.178 | 0.039 |
| 0.304 | 0.284 | 0.293 | 0.239 | 0.3 | 0.287 | 0.239 | 0.036 |
| 0.473 | 0.049 | 0.018 | 0.271 | 0.031 | 0.03 | 0.271 | 0.017 |
| 0.196 | 0.085 | 0.04 | 0.169 | 0.052 | 0.043 | 0.169 | 0.055 |
| 0.129 | 0.153 | 0.046 | 0.116 | 0.068 | 0.04 | 0.116 | 0.05 |
| 0.164 | 0.093 | 0.071 | 0.158 | 0.072 | 0.057 | 0.158 | 0.123 |
| 0.17 | 0.028 | 0.045 | 0.142 | 0.085 | 0.06 | 0.142 | 0.099 |
| 0.16 | 0.028 | 0.013 | 0.11 | 0.024 | 0.015 | 0.11 | 0.013 |

*FIG. 8K*

| | | | | | |
|---|---|---|---|---|---|
| 0.111 | 0.195 | 0.348 | 0.34 | 3.969 | 88% |
| 0.17 | 0.28 | 0.328 | 0.362 | 5.75 | 128% |
| 0.072 | 0.162 | 0.218 | 0.557 | 3.562 | 79% |
| 0.069 | 0.255 | 0.447 | 0.445 | 4.208 | 94% |
| 0.025 | 0.21 | 0.378 | 0.253 | 3.652 | 81% |
| 0.082 | 0.193 | 0.27 | 0.247 | 3.847 | 86% |
| 0.126 | 0.313 | 0.343 | 0.37 | 5.815 | 129% |
| 0.08 | 0.251 | 0.353 | 0.296 | 4.39 | 98% |
| 0.07 | 0.336 | 0.415 | 0.427 | 5.243 | 117% |
| 0.109 | 0.573 | 0.55 | 0.708 | 8.401 | 187% |
| 0.091 | 0.271 | 0.328 | 0.331 | 4.679 | 104% |
| 0.076 | 0.347 | 0.465 | 0.247 | 4.999 | 111% |
| 0.034 | 0.287 | 0.468 | 0.435 | 4.69 | 104% |
| 0.073 | 0.188 | 0.252 | 0.319 | 3.52 | 78% |
| 0.078 | 0.212 | 0.317 | 0.235 | 3.688 | 82% |
| 0.078 | 0.379 | 0.494 | 0.383 | 5.912 | 132% |
| 0.094 | 0.33 | 0.443 | 0.392 | 5.416 | 121% |
| 0.075 | 0.25 | 0.355 | 0.381 | 4.589 | 102% |
| 0.036 | 0.178 | 0.254 | 0.813 | 6.289 | 140% |
| 0.053 | 0.239 | 0.382 | 1.072 | 7.326 | 163% |
| 0.022 | 0.271 | 0.461 | 0.399 | 4.329 | 96% |
| 0.038 | 0.169 | 0.193 | 0.329 | 3.025 | 67% |
| 0.051 | 0.116 | 0.138 | 0.228 | 2.302 | 51% |
| 0.065 | 0.158 | 0.186 | 0.194 | 2.977 | 66% |
| 0.047 | 0.142 | 0.202 | 0.147 | 2.606 | 58% |
| 0.019 | 0.11 | 0.16 | 0.205 | 1.872 | 42% |

*FIG. 8L*

| | | | | | | |
|---|---|---|---|---|---|---|
| Y13 | 0.438 | 0.083 | 0.077 | 0.207 | 0.228 | 0.077 |
| Y12 | 0.566 | 0.359 | 0.245 | 0.251 | 0.269 | 0.245 |
| Z19 | 0.23 | 0.266 | 0.16 | 0.006 | 0.043 | 0.16 |
| Z18 | 0.33 | 0.211 | 0.16 | 0.011 | 0.037 | 0.16 |
| Z17 | 0.171 | 0.141 | 0.125 | 0.022 | 0.046 | 0.125 |
| Z16 | 0.203 | 0.149 | 0.134 | 0.071 | 0.058 | 0.134 |
| Z15 | 0.274 | 0.241 | 0.195 | 0.089 | 0.065 | 0.195 |
| Z14 | 0.217 | 0.202 | 0.165 | 0.028 | 0.032 | 0.165 |
| Z13 | 0.252 | 0.127 | 0.126 | 0.059 | 0.07 | 0.126 |
| Z12 | 0.09 | 0.258 | 0.161 | 0.008 | 0.005 | 0.161 |
| AA19 | 0.195 | 0.206 | 0.094 | 0.051 | 0.061 | 0.094 |
| AA18 | 0.269 | 0.117 | 0.079 | 0.061 | 0.061 | 0.079 |
| AA17 | 0.203 | 0.106 | 0.076 | 0.076 | 0.064 | 0.076 |
| AA16 | 0.181 | 0.121 | 0.09 | 0.083 | 0.074 | 0.09 |
| AA15 | 0.407 | 0.502 | 0.302 | 0.114 | 0.09 | 0.302 |
| AA14 | 0.355 | 0.444 | 0.303 | 0.088 | 0.094 | 0.303 |
| AA13 | 0.235 | 0.133 | 0.109 | 0.088 | 0.093 | 0.109 |
| AA12 | 0.162 | 0.32 | 0.204 | 0.035 | 0.036 | 0.204 |

FIG. 8M

| | | | | | | | |
|---|---|---|---|---|---|---|---|
| 0.208 | 0.222 | 0.077 | 0.216 | 0.208 | 0.077 | 0 | 0 |
| 0.251 | 0.251 | 0.245 | 0.251 | 0.251 | 0.245 | 0 | 0 |
| 0 | 0 | 0.16 | 0.014 | 0.01 | 0.16 | 0 | 0.027 |
| 0.025 | 0.009 | 0.16 | 0.016 | 0.007 | 0.16 | 0.007 | 0.018 |
| 0.036 | 0.018 | 0.125 | 0.028 | 0.014 | 0.125 | 0.005 | 0 |
| 0.08 | 0.053 | 0.134 | 0.039 | 0.029 | 0.134 | 0.005 | 0.005 |
| 0.061 | 0.044 | 0.195 | 0.061 | 0.043 | 0.195 | 0.005 | 0 |
| 0.026 | 0.049 | 0.165 | 0.035 | 0.034 | 0.165 | 0 | 0 |
| 0.058 | 0.056 | 0.126 | 0.042 | 0.046 | 0.126 | 0 | 0 |
| 0 | 0.002 | 0.161 | 0.001 | 0.006 | 0.161 | 0 | 0 |
| 0.05 | 0.05 | 0.094 | 0.053 | 0.052 | 0.08 | 0.05 | 0.05 |
| 0.051 | 0.053 | 0.079 | 0.056 | 0.055 | 0.066 | 0.052 | 0.05 |
| 0.077 | 0.053 | 0.076 | 0.057 | 0.056 | 0.063 | 0.05 | 0.05 |
| 0.081 | 0.062 | 0.09 | 0.062 | 0.055 | 0.076 | 0.05 | 0.056 |
| 0.093 | 0.069 | 0.302 | 0.07 | 0.087 | 0.288 | 0.05 | 0.05 |
| 0.084 | 0.087 | 0.303 | 0.086 | 0.098 | 0.289 | 0.05 | 0.05 |
| 0.091 | 0.096 | 0.109 | 0.089 | 0.094 | 0.095 | 0.05 | 0.05 |
| 0.037 | 0.035 | 0.204 | 0.036 | 0.039 | 0.193 | 0.035 | 0.035 |

FIG. 8N

| | | | | | | | |
|---|---|---|---|---|---|---|---|
| 0.081 | 0.223 | 0.221 | 0.077 | 0.208 | 0.207 | 0.077 | 0.004 |
| 0.314 | 0.251 | 0.259 | 0.245 | 0.251 | 0.251 | 0.245 | 0.007 |
| 0.26 | 0.004 | 0.022 | 0.16 | 0.012 | 0.02 | 0.16 | 0.014 |
| 0.181 | 0.012 | 0.032 | 0.16 | 0.059 | 0.018 | 0.16 | 0.076 |
| 0.129 | 0.027 | 0.07 | 0.125 | 0.043 | 0.018 | 0.125 | 0.054 |
| 0.134 | 0.037 | 0.076 | 0.134 | 0.049 | 0.028 | 0.134 | 0.109 |
| 0.199 | 0.042 | 0.08 | 0.195 | 0.081 | 0.055 | 0.195 | 0.084 |
| 0.195 | 0.027 | 0.067 | 0.165 | 0.052 | 0.04 | 0.165 | 0.044 |
| 0.156 | 0.052 | 0.053 | 0.126 | 0.05 | 0.052 | 0.126 | 0.078 |
| 0.262 | 0.006 | 0.008 | 0.161 | 0.007 | 0.002 | 0.161 | 0.033 |
| 0.187 | 0.051 | 0.06 | 0.08 | 0.054 | 0.054 | 0.08 | 0.076 |
| 0.1 | 0.056 | 0.059 | 0.066 | 0.071 | 0.069 | 0.066 | 0.095 |
| 0.087 | 0.061 | 0.081 | 0.063 | 0.068 | 0.082 | 0.063 | 0.108 |
| 0.099 | 0.081 | 0.085 | 0.076 | 0.063 | 0.077 | 0.076 | 0.116 |
| 0.439 | 0.085 | 0.089 | 0.288 | 0.117 | 0.095 | 0.288 | 0.138 |
| 0.475 | 0.078 | 0.096 | 0.289 | 0.096 | 0.096 | 0.289 | 0.119 |
| 0.143 | 0.087 | 0.081 | 0.095 | 0.098 | 0.089 | 0.095 | 0.122 |
| 0.312 | 0.039 | 0.035 | 0.193 | 0.041 | 0.036 | 0.193 | 0.067 |

FIG. 80

| | | | | | |
|---|---|---|---|---|---|
| 0.022 | 0.077 | 0.096 | 0.391 | 3.802 | 85% |
| 0.045 | 0.245 | 0.359 | 0.928 | 6.829 | 152% |
| 0.004 | 0.16 | 0.264 | 0.253 | 2.569 | 57% |
| 0.044 | 0.16 | 0.201 | 0.282 | 2.696 | 60% |
| 0.052 | 0.125 | 0.139 | 0.223 | 2.111 | 47% |
| 0.06 | 0.134 | 0.149 | 0.199 | 2.471 | 55% |
| 0.06 | 0.195 | 0.258 | 0.277 | 3.384 | 75% |
| 0.025 | 0.165 | 0.204 | 0.309 | 2.741 | 61% |
| 0.047 | 0.126 | 0.156 | 0.162 | 2.398 | 53% |
| 0.024 | 0.161 | 0.262 | 0.033 | 2.134 | 48% |
| 0.056 | 0.08 | 0.193 | 0.241 | 2.392 | 53% |
| 0.067 | 0.066 | 0.1 | 0.239 | 2.182 | 49% |
| 0.078 | 0.063 | 0.092 | 0.18 | 2.109 | 47% |
| 0.114 | 0.076 | 0.107 | 0.181 | 2.322 | 52% |
| 0.119 | 0.288 | 0.484 | 0.463 | 5.619 | 125% |
| 0.114 | 0.289 | 0.41 | 0.517 | 5.502 | 122% |
| 0.122 | 0.096 | 0.143 | 0.219 | 2.83 | 63% |
| 0.063 | 0.193 | 0.312 | 0.143 | 3.202 | 71% |

| | P | Q | R | S | T | U | V | W | X | Y | Z | AA |
|---|---|---|---|---|---|---|---|---|---|---|---|---|
| 19 | 135% | 92% | 81% | 63% | 121% | 97% | 46% | 81% | 104% | 96% | 57% | 53% |
| 18 | 136% | 101% | 94% | 81% | 122% | 62% | 92% | 86% | 78% | 67% | 60% | 49% |
| 17 | 114% | 84% | 63% | 115% | 172% | 102% | 186% | 129% | 82% | 51% | 47% | 47% |
| 16 | 100% | 104% | 88% | 89% | 146% | 85% | 111% | 98% | 132% | 66% | 55% | 52% |
| 15 | 107% | 179% | 153% | 83% | 116% | 76% | 88% | 117% | 121% | 58% | 75% | 125% |
| 14 | 103% | 199% | 175% | 87% | 207% | 125% | 128% | 187% | 102% | 42% | 61% | 122% |
| 13 | 115% | 97% | 96% | 65% | 103% | 84% | 79% | 104% | 140% | 85% | 53% | 63% |
| 12 | 106% | 176% | 180% | 64% | 69% | 68% | 94% | 111% | 163% | 152% | 48% | 71% |

METHOD FOR ANALYZING MATERIAL DENSITY VARIATIONS ON A MULTI-LAYER PRINTED CIRCUIT BOARD

BACKGROUND OF THE INVENTION

1. Field of the Invention

The present invention relates to semiconductor circuit boards and, more particularly, to a system and method for calculating material density variations in multi-layer printed circuit boards.

2. General Background

Material, such as copper, density variation analysis is performed in the semiconductor industry as a metric for determining manufactured semiconductor board quality. Calculating the density variations for designing the printed circuit board is often required in the manufacturing process to assess manufacturing defects. Specifically, larger the variation in material density the more likely the board will exhibit mechanical and thermal defects. Thus, the density variation analysis is used for the purpose of making copper pattern density substantially uniform across the board.

One mechanism to determine material density variation is through the use of ultra-violet light and glass based system 1 as shown in FIG. 1. Shown therein, is a bottom and top glass exposure layers 2 and 4 respectively. Sandwiched between these layers are a top and a bottom photo-tool layers 6 and 8 respectively. The photo-tool layers 6 and 8 are brought in contact with the multi-layer printed circuit board 10 having material (e.g., copper) variations, generally depicted as 12 and 14. An ultra-violet light is transmitted from one end 16 towards a sheet of material (not shown) positioned at another end 18. The interference pattern observed on the sheet material provides feedback means for identifying material variations on the printed circuit board. However, there are several disadvantages with this system including, (i) the system being expensive, (ii) the need for contacting the multi-layer printed circuit board with the photo-tools/exposure glass system thereby increasing the likelihood of damaging the circuit board.

Density variation analysis is useful for determining other important scalar properties, for example, defect susceptibility, power dissipation, etc. for purposes of modeling and/or correction for these properties. The density variation analysis also is used to estimate yield loss due to densities that are too low or too high in layers of the design. The density variation analysis may be used to evaluate non-uniformities in height across the circuit board due to variations in density. Density analysis may be anywhere from about 10% to about 50% for standard designs.

Therefore, a need exists for an efficient and cost-effective method for determining density variations of the material in a printed circuit board.

SUMMARY OF THE INVENTION

The present invention is a method for determining material density variations in a multi-layer printed circuit board (PCB), in three directions (viz., along x, y, and z axis), thereby allowing defects in the board to be predicted.

In one embodiment of the present invention, The material (e.g., copper) layers of the PCB design are aligned using a software program in a computer system. A variable rectangular grid system is "virtually" created as a reference tool over the entire area of the PCB using the outermost edges of the PCB or panelized PCB. Each layer of the multi-layer is analyzed for the total square area of the material present within each grid element on that layer (the grid size may be variable). The area of material present for each layer grid element is added to together for all layers to form the total amount of material within that PCB grid element. This is completed for all grid elements covering the entire PCB. The average amount of material over all grid elements is determined, and the amount of copper per PCB grid element is then compared to the determined average and a numerical value is assigned to that grid element which represents the percentage of copper within that grid element. Doing this for all grid elements, the invention is able to generate a contour map, depicting material density variations, for determining density variations and subsequent defect prediction.

Clearly, analyzing relative density variations of the complete (i.e., all three axis) PCB design prior to manufacturing, using a computer software approach, provides a scientific view of the PCB circuit density patterns and variations prior to manufacturing. This information may then be used to adjust either the PCB design or PCB manufacturing process to eliminate or substantially minimize defects in the PCB.

In another embodiment of the present invention, the method for determining the density variations of a material on a multi-layer printed circuit board comprises: (i) forming a grid system on each layer in the multi-layer printed circuit board; (ii) determining the area occupied by the material in each grid element, of the grid system, on each of the layers in the multi-layer printed circuit board; and (iii) computing a measure of the density from the area of the material, in each grid element, on the multi-layer printed circuit board. Furthermore, there could be several ways of determining the measure of density in the X, Y, and Z direction. One aspect of the invention, for determining the measure of density in the X, Y, and Z direction, could use the steps of: (a) adding the area occupied by the material in the each grid element in neighbor layers to obtain a sum area for said grid element, said each grid element having the same coordinates in all the layers; and (b) determining an average of the sum area over all grid elements; and (c) dividing the sum area for the each grid element with the average of the sum area to compute the measure of the density of the material for said grid. The material, for which the density is determined, may be copper found on PCB's or any other material used in semiconductor devices. Additionally, the grid elements may be rectangular, circular, or any other polygonal shape, or any combination of these. Furthermore the method may be used to predict a defect in the PCB from the measure of the density of the material. Also, a contour map may be generated showing the variation in the measure of the density of the material on the multi-layer printed circuit board.

In another embodiment of the present invention, a method for predicting a defect on a multi-layer printed circuit board comprises: (i) forming a grid system on each layer in the multi-layer printed circuit board; (ii) determining the area occupied by the material in each grid element, of the grid system, on each of the layers in the multi-layer printed circuit board; (iii) computing a measure of the density from the area of the material, in each grid element, on the multi-layer printed circuit board; (iv) predicting a defect in the multi-layer printed circuit board from the measure of the density of the material. Furthermore, there could be several ways of determining the measure of density in the X, Y, and Z direction. One aspect of the invention, for determining the measure of density in the X, Y, and Z direction, could use the steps of: (a) adding the area occupied by the material in the each grid element in neighbor layers to obtain a sum area for said grid element, said each grid element having the same co-ordinates in all the layers; (b) determining an average of the sum area over all grid elements; and (c) dividing the sum area for the each grid element with the average of the sum area to compute the measure of the density of the material for said grid.

BRIEF DESCRIPTION OF THE DRAWINGS

In order that the manner in which the above-recited advantages and objects of the invention are attained, as well as others which will become apparent, more particular description of the invention briefly summarized above may be had by reference to the specific embodiments thereof that are illustrated in the appended drawings. It is to be understood, however, that the appended drawings illustrate only typical embodiments of the invention and are therefore not to be considered limiting of its scope, for the invention may admit to other equally effective embodiments.

In the drawings:

FIGS. 8A–8P shows an exemplary chart for computing the density of the material in a multi-layer PCB;

FIG. 9 shows an exemplary view of the grid data showing the percentage of material (viz., copper) relative to the average (100%).

DETAILED DESCRIPTION OF THE INVENTION

Figure 1:
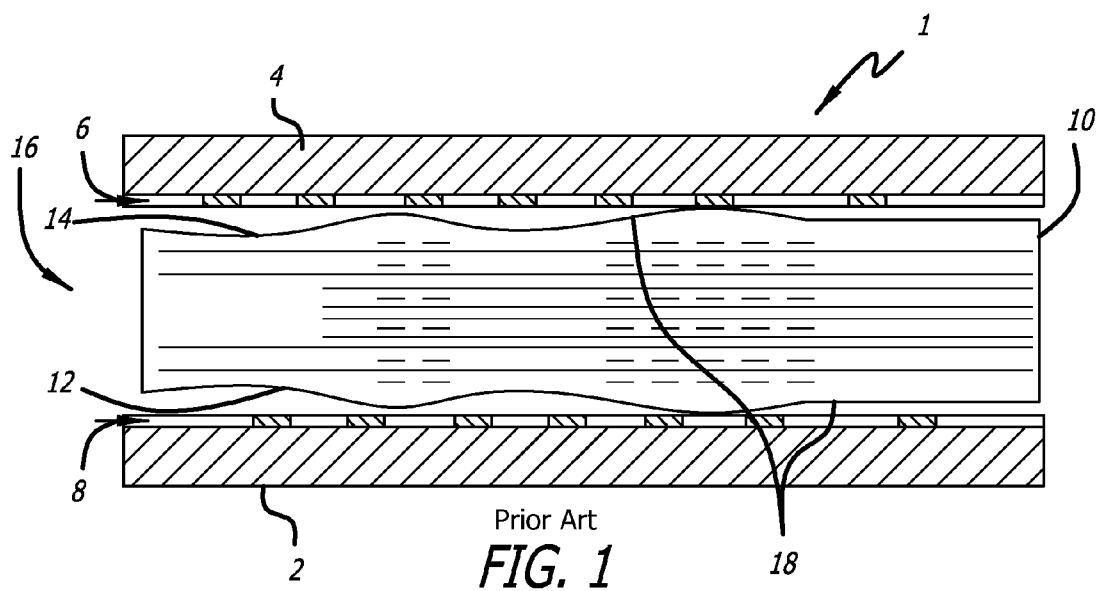
FIG. 1 is a prior art system that is used for detecting density variations on a printed circuit board (PCB)

Referring now in detail and by reference characters to the drawings (FIGS. 2–9), which illustrate several different embodiments of the present invention, therein shown is a methodology for determining material density in the X, Y, and Z axis of a printed circuit board (PCB). Specifically, a virtual grid system is created for the PCB, and the amount of material in each grid element, over all layers, of the PCB is determined. Data collected, on the amount of material, is used to determine the material density on the PCB, thereby allowing the visualization of thickness variations of the material on the PCB. Furthermore, defects on the PCB can be predicted by determining appropriate threshold for density variations on the PCB.

Figure 2:
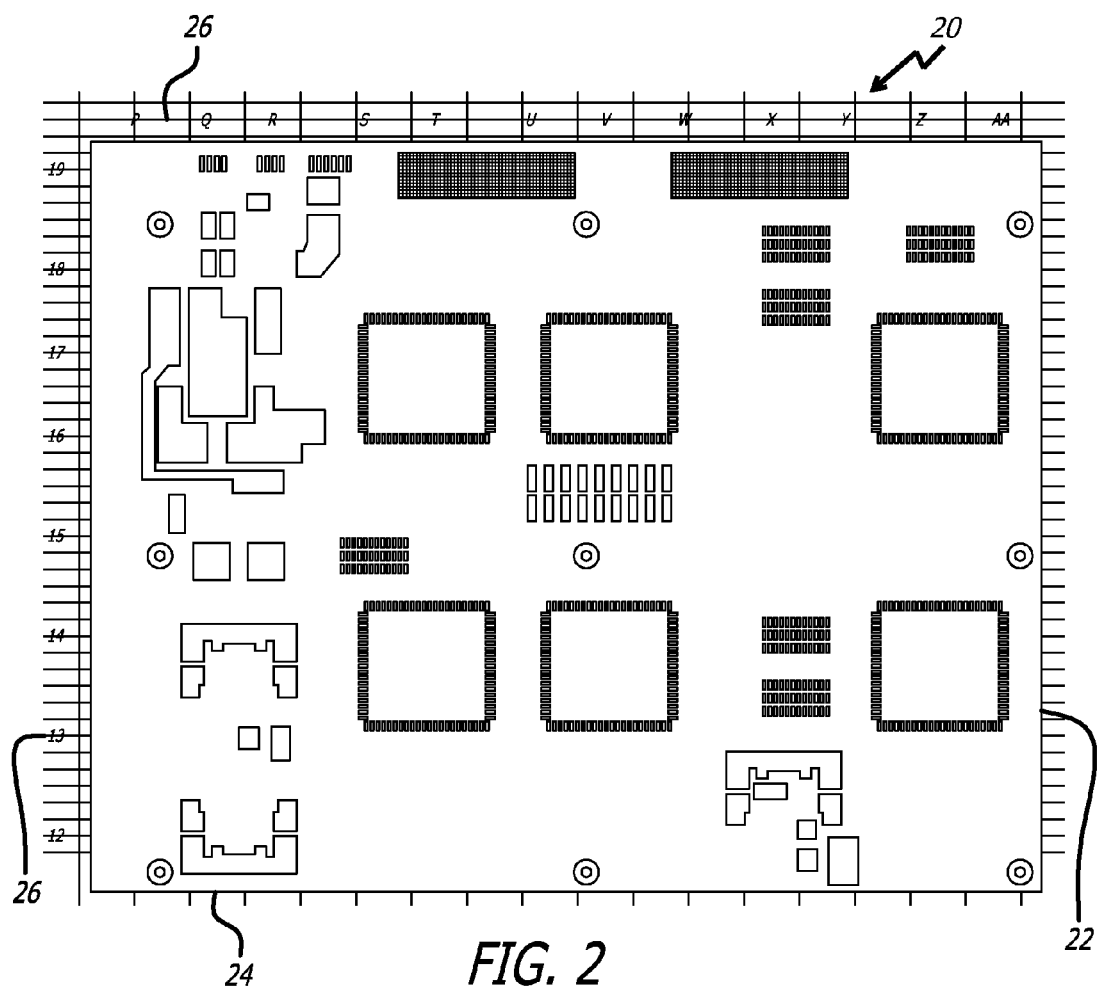
FIG. 2 is a depiction of a grid formation system, for a multi-layer PCB, according to one aspect of the present invention.
Figure 6:
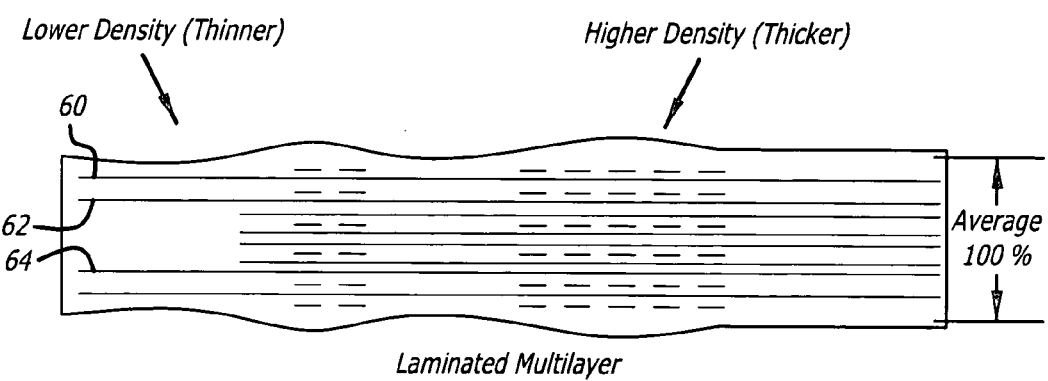
FIG. 6 shows a cross-sectional view of all of the layers within the PCB (along X, Y and Z axis) and assigns them to a grid to determine the finished board material density.

FIG. 2 shows an exemplary depiction of a virtual grid system 20, formed on a PCB 22, that includes a set of grid elements 24 and grid co-ordinates 26 (e.g., the X co-ordinate of a grid element could be Q and Y co-ordinate could be 15) that identify each grid element 24 on the top layer of PCB 22. In this example, each of the grid elements 24 is rectangular in shape, but it could be of any other appropriate polygonal shape. The Z co-ordinate, though not shown here in this two dimensional view, but will be apparent in FIG. 6, is also used to identify grid elements in lower layers of the PCB.

The amount of material (e.g., copper) in each of the grid elements 24 may be determined by an appropriate software. For example, Valor Enterprise 3000, available from Valor Computerized Systems Ltd., was used as the "Copper/Exposed Measurement" tool for measuring the amount of copper in all grid elements 24 in all of the layers within a PCB.

Figure 3:
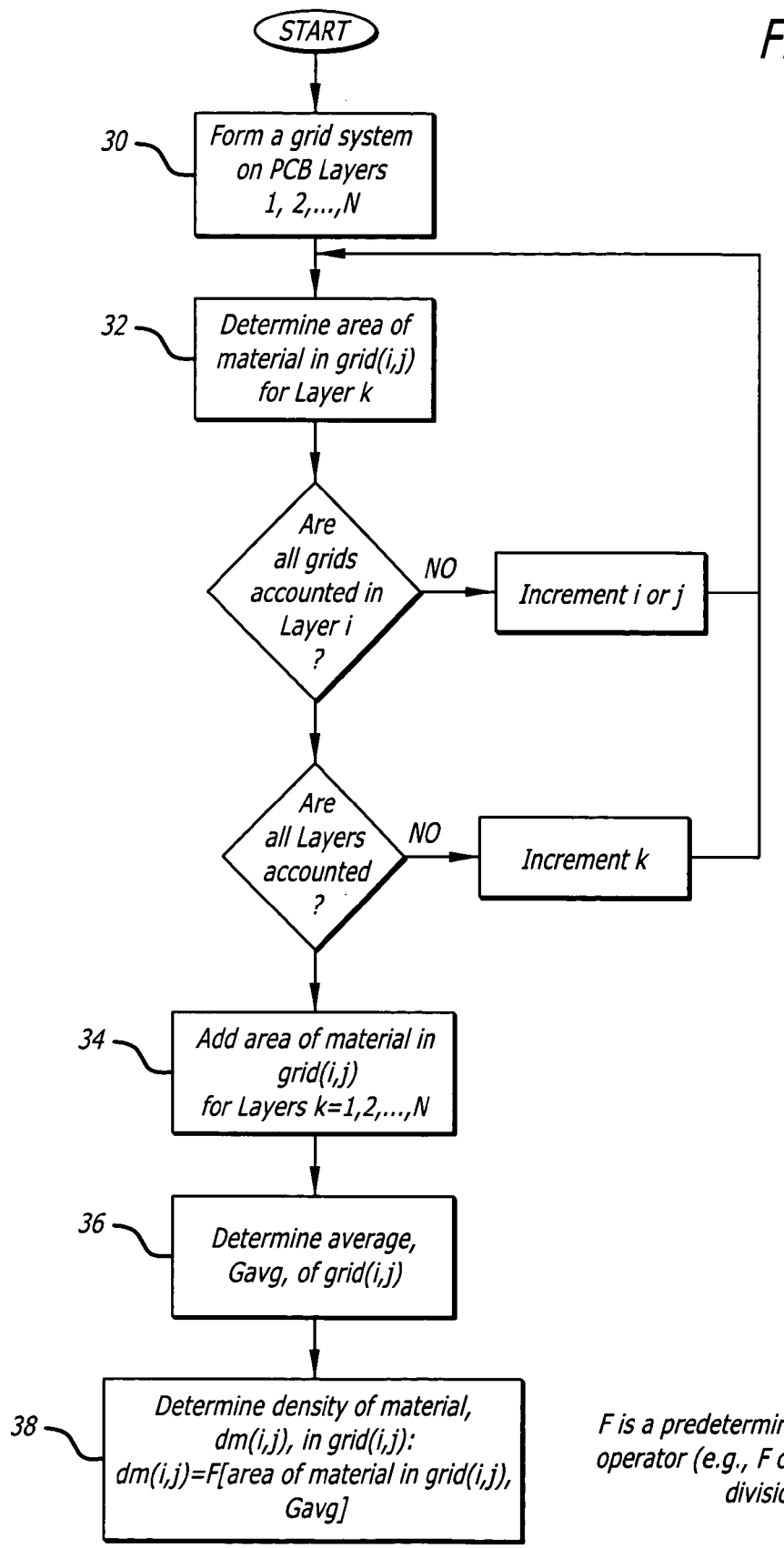
FIG. 3 is a flow chart for determining density variations in the X, Y, and Z directions of a multi-layer PCB.

FIG. 3 is a flow chart for determining density variations in the X, Y, and Z directions of a multi-layer PCB. In the first step 30, the virtual grid system is created to identify the grid elements in all layers of the multi-layer PCB. The amount of material in each grid element (i,j) in layer k is then determined as shown by block 32. For example, in the grid system of FIG. 2, grid(i,j) in layer 1 could represent the grid element with coordinates i=Q and j=15 in layer 1. The determination of the amount of material in all of the grids in all layers is completed, before determining the total amount of material (or area occupied by material) in each grid for all layers (shown as block 34). For example, the amount of material (as indicated by the area occupied by the material) in grid element i=Q and j=15 is added overall layers k=1 though N. Specifically, $$\text{total\_amount}(i, j) = \sum_{k=1}^{N} \text{amount}(i, j, k) \quad (1)$$

where, amount(i,j,k) is the area occupied by the material in grid element (i,j) in layer k, and total_amount represents the total occupied area of the material in grid element (i,j) summed over all layers k=1, ... ,N.

In the subsequent step (shown as block 36), the average Gavg, of the area occupied by the material, is found over all grid elements using, $$Gavg = (1/D) \sum_{i} \sum_{j} \text{total\_amount}(i, j) \quad (2)$$

where D is the total number of grids.

In the last step (depicted by block 38), the density of the material, dm(i,j), in grid element (i,j) may be determined by using Gavg and total_amount(i,j) in some functional form F(.,.). For example, in one aspect of the invention, F(.,.) could be the division operator, where $$dm(i, j) = \frac{\text{total\_amount}(i, j)}{Gavg} \quad (3)$$

Figure 4:
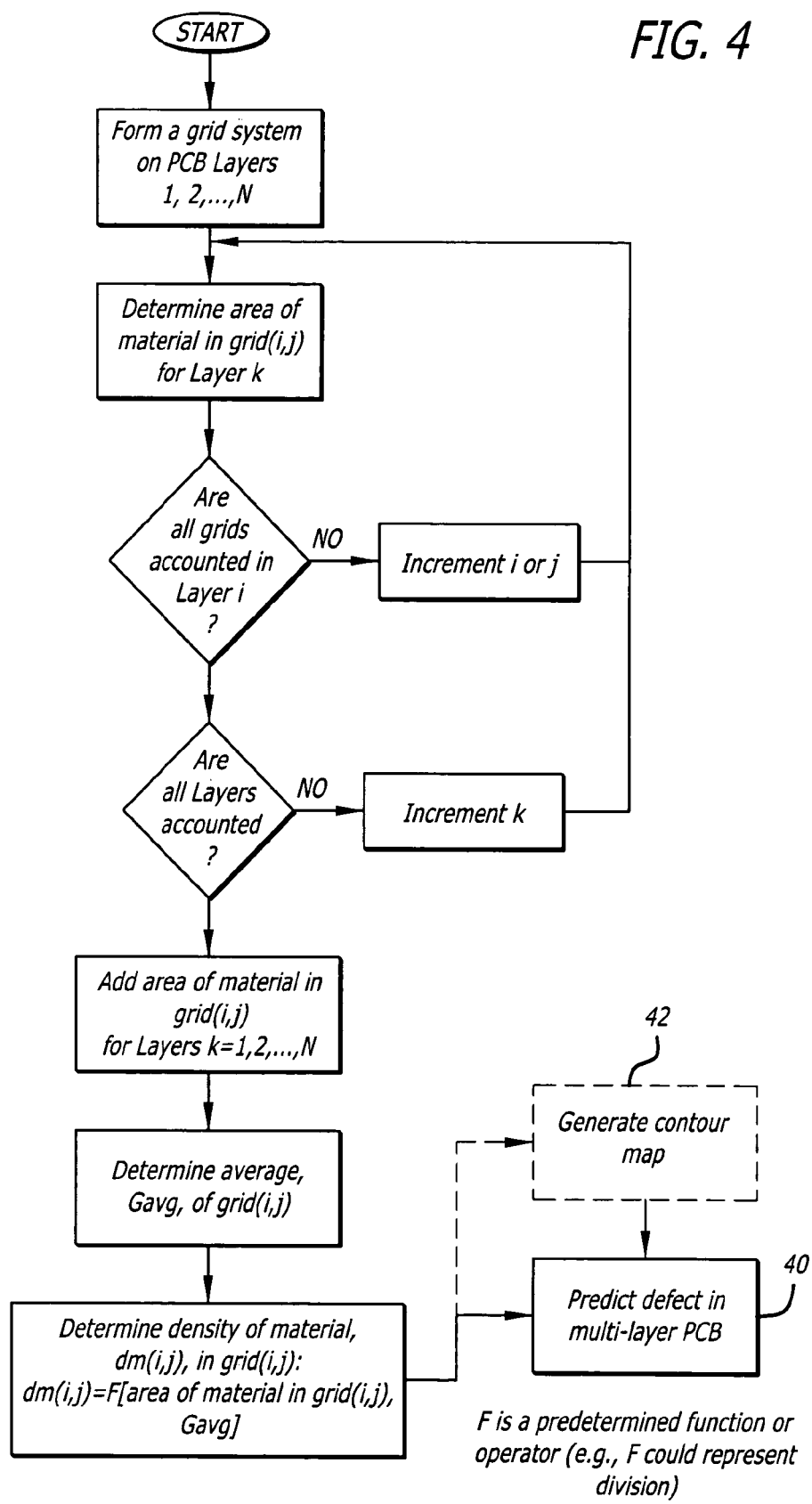
FIG. 4 is a flow chart for predicting defects from the density variations in the X, Y, and Z directions on a multi-layer PCB.

FIG. 4 is a flow chart for predicting defects, from the density variations in the X, Y, and Z directions, on a multi-layer PCB. This prediction (as depicted by the block 40) may be done, in one aspect of the invention, by observing if dm(i,j) is greater than or less than a predetermined threshold(i,j). By generating a histogram, for the number of dm(i,j)'s that are greater than the predetermined threshold (i,j), it may be possible to predict with a certain probability whether there will be a defect in the manufactured PCB. In addition, a contour map (depicted as block 42) showing the material density variations (and thickness variations of the material) may be generated as a visualization tool.

Figure 5:
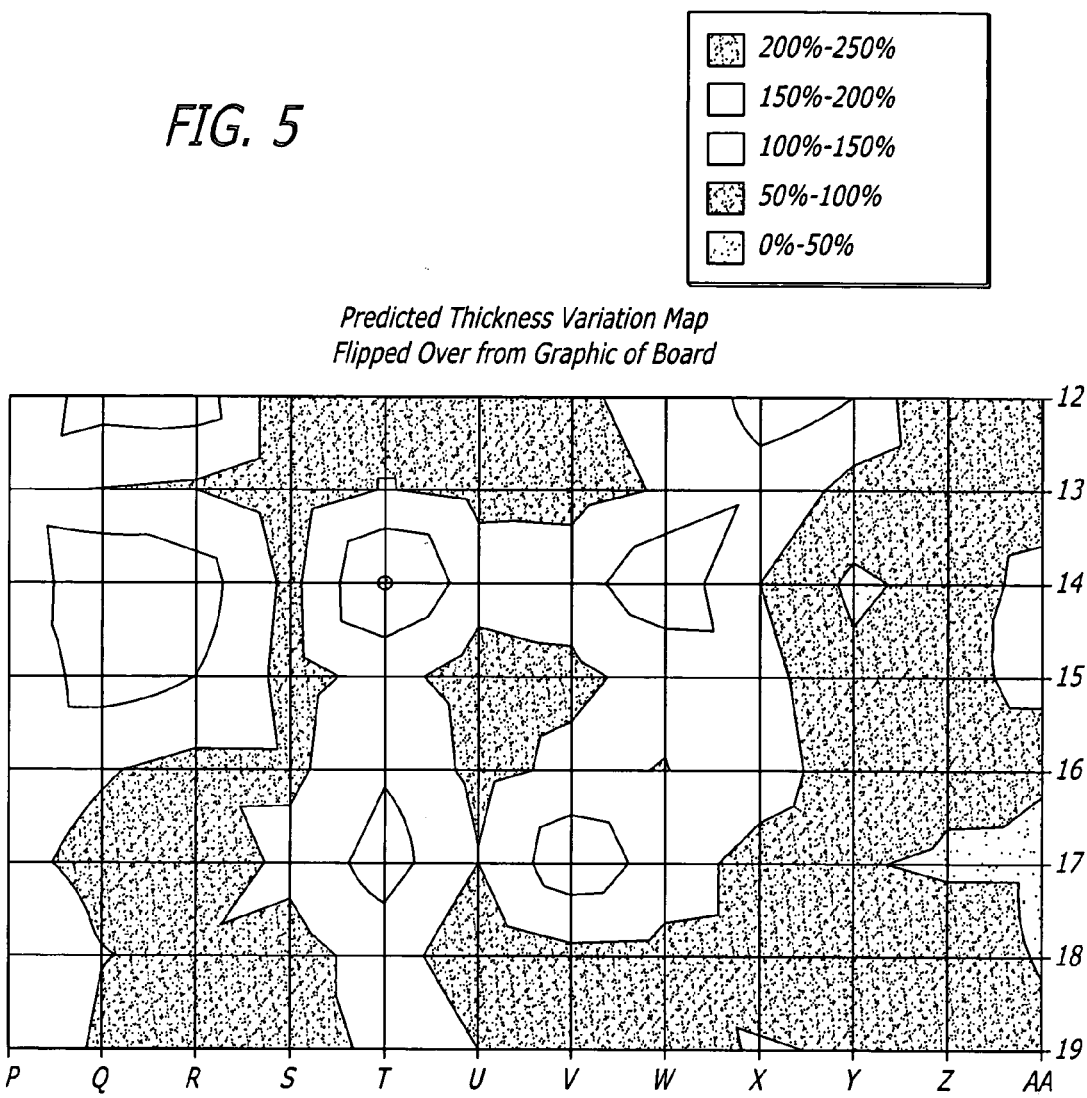
FIG. 5 is a contour map of a 14.4"×10.97" PCB, clearly identifying the variations in the material density.

FIG. 5 is a contour map of a 14.4"×10.97" PCB, clearly showing the variations in the material density in the X, Y, and Z directions for visualization purposes. The variation in material (e.g., copper) density clearly impacts two fundamental characteristics of the finished PCB—mechanical (thickness) and thermal (temperature). While the thickness of the PCB is a measurable requirement to most stated specifications, the thermal variations play a part in both PCB manufacturing as well a PCB assembly. There are other variables that may impact mechanical variation within the PCB manufacturing process. Some of these include b-stage type, lamination press cycle, and type of separator plates CAC (copper-aluminum-copper), stainless steel, etc. These variables can in some cases overcome small variations in density variation but only to a certain point. Thickness variation stems from fundamentally one characteristic, the design of the copper or material layers on the PCB. The majority of the parts produced are relatively equally distributed and don't cause an issue that would alarm an operator or cause significant yield loss. However as new layers are continuously added, the amount of variation within the copper distribution becomes more and more critical to manufacturing a PCB with consistent thickness.

The root cause of thickness variation is unbalanced copper. Some areas within a PCB are very dense with copper and others have little or no copper when viewed through the board in the z-axis. This is what causes variation in panel thickness. How much variation is determined by the following characteristics, assuming that all things are equal in the PCB manufacturing process: (i) distance from a low density area to a high density area, (ii) amount of variation from a low density area to a high density areas. The final analysis computes the slope (delta) between low and high copper density areas.

FIG. 6 shows a cross-sectional view of the layers 60, 62, 64 within the PCB (along Y and Z axis) and assigns them to a grid to determine the finished board material density. All of the PCB layers are analyzed for density determination and subsequent prediction for defects. The analysis takes into account all of the layers within the structure (i.e., in the X, Y and Z axis) and assigns them to a grid to fully depict the finished board material density. The figure shows low material density areas which translates to a thinner material presence, and a high density area which corresponds to a thicker material presence.

Figure 7:
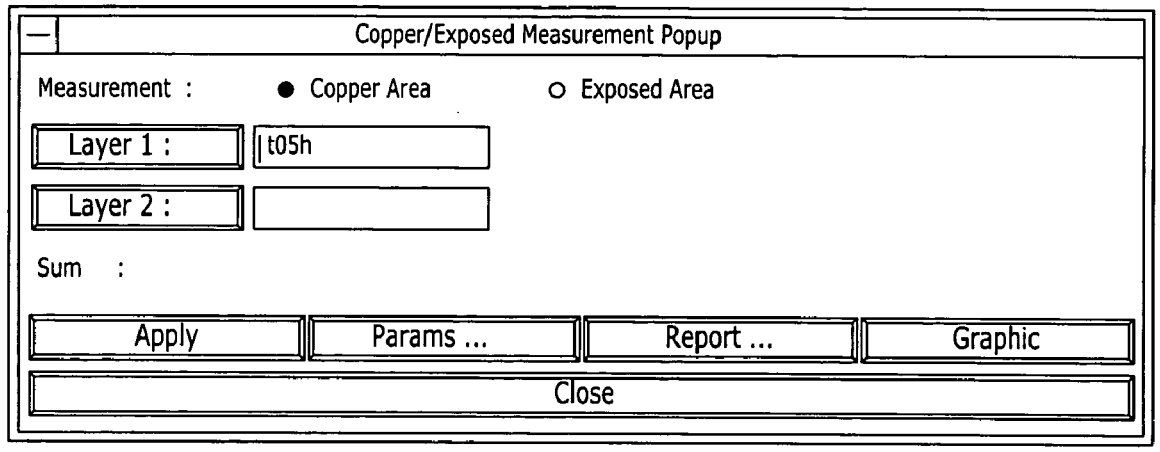
FIG. 7 is an exemplary view of a report identifying the amount of material (viz., copper) within each grid of the PCB.

FIG. 7 is an exemplary view of a report identifying the amount of material (viz., copper) within each grid of the PCB each layer that was analyzed. The report, identifying the amount of copper within each grid, may be output to a statistical data analysis package (e.g., Microsoft EXCEL, SAS, etc.) for data analysis and for generating the contour map depicting the material density variation on the multi-layer PCB.

FIGS. 8a–8p show an exemplary chart for computing the density of the material in a multi-layer PCB. Specifically, each number in the chart corresponds to the total amount of copper in a grid element on a given layer. The grid element label is shown along the vertical axis and the layer label is shown along the horizontal axis. The total copper in grid (over all layers) column shows the result obtained by using equation (1). The average amount of copper in the PCB, also shown in the cart, is computed using equation (2). The column showing the percentage of the average (or the density of the material in each grid element) is computed by using equation (3).

FIG. 9 shows the same data of FIG. 8, indicating material density in each grid element, in a matrix format. This view allows easy visualization of the material density in each grid element of the multi-layer PCB.

There are several advantages on using the method of the present invention for determining material density variations. These include: (i) yield improvement (viz., reduction of opens or off contact printing); (ii) potential capability to reduce TDR tolerance below 10% as a standard; (iii) operational cost reductions based on improved knowledge of when alternative process methods are required (viz., CAC/SS and glass vs mylar to offset variations that are not able to be improved based on customer requirements); (iv) improved solder-mask thickness distribution and associated yield; (v) improved lamination process control (i.e., by targeting high, medium and low density areas for thermocouple analysis); (vi) improved solder paste thickness consistency and placement accuracy; (vii) reduction in bow and twist; (viii) baseline data that can fed into PCB thermal analysis and profiling; (ix) on time shipment improvement due to reduced scrap for variation related defects; (x) raw data to support requests to add thieving to inner layers will increase the acceptance from the OEM (design improvement).

While the specification describes particular embodiments of the present invention, those of ordinary skill can devise variations of the present invention without departing from the inventive concept. For example, the grid elements may be of arbitrary polygonal shape, alternative equations (e.g., standard deviation) may be used to compute material density variations on the multi-layer PCB.

I claim the following:

1. A method for determining the density variations of a material on a multi-layer printed circuit board, the method comprising:

forming a grid system on each layer in the multi-layer printed circuit board;

determining the area occupied by the material in each grid element, each grid element having unique grid system co-ordinates of the grid system, on each of the layers in the multi-layer printed circuit board;

computing a measure of the density from the area of the material, in grid elements, in at least two of the layers in the multi-layer printed circuit board;

adding the area occupied by the material in each grid element in neighbor layers having the same grid system co-ordinates to obtain a sum area; and determining an average of the sum area over all grid elements.

2. The method according to claim 1, wherein the material includes copper (Cu).

3. The method according to claim 1, wherein said each grid element is rectangular.

4. The method according to claim 1, further including the step of dividing the sum area with the average of the sum area over all grid elements to compute the measure of the density of the material for said multi-layer printed circuit board.

5. The method according to claim 4, further including the step of generating a contour map showing the variation in the measure of the density of the material on the multi-layer printed circuit board.

6. The method according to claim 1, further including the step of predicting a defect in the multi-layer printed circuit board from the measure of the density of the material.

7. A method for predicting a defect on a multi-layer printed circuit board, the method comprising:

forming a grid system on each layer in the multi-layer printed circuit board;

determining the area occupied by the material in each grid element, of the grid system, on each of the layers in the multi-layer printed circuit board;

computing a measure of the density from the area of the material, in grid elements, in at least two of the layers in the multi-layer printed circuit board;

predicting a defect in the multi-layer printed circuit board from the measure of the density of the material;

adding the area occupied by the material in each grid element in neighbor layers having the same grid system co-ordinates to obtain a sum area; and determining an average of the sum area over all grid elements.

8. The method according to claim 7, further including the step of dividing the sum area with the average of the sum area over all grid elements to compute the measure of the density of the material for said multi-layered printed circuit board.

9. The method according to claim 8, further including the step of generating a contour map showing the variation in the measure of the density of the material on the multi-layer printed circuit board.

10. The method according to claim 7, wherein the material includes copper (Cu).

11. The method according to claim 7, wherein said each grid element is rectangular.

12. A system for determining the density variations of a material on a multi-layer printed circuit board, the system comprising:

means for forming a grid system on each layer in the multi-layer printed circuit board;

means for determining the area occupied by the material in each grid element, of the grid system, on each of the layers in the multi-layer printed circuit board;

means for computing a measure of the density from the area of the material, in grid elements, in at least two layers of the multi-layer printed circuit board;

means for adding the area occupied by the material in the each grid element in neighbor layers having the same co-ordinates to obtain a sum area; and means for determining an average of the sum area over all grid elements.

13. The system according to claim 12, wherein the material includes copper (Cu).

14. The system according to claim 12, wherein said each grid element is rectangular.

15. The system according to claim 12, further including means for dividing the sum area with the average of the sum area to compute the measure of the density of the material for said multi-layer printed circuit board.

16. The system according to claim 15, further including means for generating a contour map showing the variation in the measure of the density of the material on the multi-layer printed circuit board.

17. The system according to claim 12, further including means for predicting a defect in the multi-layer printed circuit board from the measure of the density of the material.

* * * * *